United States Patent [19]

Bahl

[11] Patent Number: 5,805,043
[45] Date of Patent: Sep. 8, 1998

[54] HIGH Q COMPACT INDUCTORS FOR MONOLITHIC INTEGRATED CIRCUIT APPLICATIONS

[75] Inventor: Inder J. Bahl, Roanoke, Va.

[73] Assignee: ITT Industries, Inc., White Plains, N.Y.

[21] Appl. No.: 720,672

[22] Filed: Oct. 2, 1996

[51] Int. Cl.$^6$ .............................. H01F 5/00; H01F 27/28
[52] U.S. Cl. ..................... 336/200; 336/232; 336/223
[58] Field of Search .......................... 336/200, 232, 336/223

[56] References Cited

U.S. PATENT DOCUMENTS

| | | | |
|---|---|---|---|
| 5,202,752 | 4/1993 | Honjo | 257/678 |
| 5,352,627 | 10/1994 | Cooper | 437/105 |
| 5,446,425 | 8/1995 | Banba | 333/116 |

FOREIGN PATENT DOCUMENTS

| | | | |
|---|---|---|---|
| 57-225342 | 3/1984 | Japan | 336/200 |
| 3-276604 | 6/1991 | Japan | 336/232 |
| 3-276604 A | 12/1991 | Japan | 336/232 |

*Primary Examiner*—Michael L. Gellner
*Assistant Examiner*—Anh Mai
*Attorney, Agent, or Firm*—Plevy & Associates

[57] ABSTRACT

A monolithic inductor device is disclosed which typically includes a substrate. The improvement includes a layer of dielectric material disposed over the substrate. A first inductor pattern disposed on the substrate and a second inductor pattern disposed on the dielectric layer. The inductor patterns are coupled together to form a single inductive element, which has reduced dissipation losses and an improved frequency response due to the dielectric material.

16 Claims, 2 Drawing Sheets

HIGH Q COMPACT INDUCTORS FOR MONOLITHIC INTEGRATED CIRCUIT APPLICATIONS

RELATED APPLICATIONS

The Assignee herein, ITT Corporation, is the record owner of co-pending U.S. application to Bahl, entitled LOW LOSS RIDGED MICROSTRIP LINE FOR MONOLITHIC MICROWAVE INTEGRATED CIRCUIT (MMIC) APPLICATIONS, filed Aug. 5, 1996, Ser. No. 08/693,868.

BACKGROUND OF THE INVENTION

1. Field of the Invention

The present invention relates generally to inductors, and more particularly to a monolithic inductor readily adaptable to standard IC fabrication processes which has an improved structure for providing low losses and a compact size.

2. Description of the Prior Art

An inductor is a reactive element utilized in a variety of electrical circuits. These devices consist of one or more coils of conductive material which introduces an inductive type of reactance into a circuit, which is measured in Henries. Another important characteristic of inductors is a quantity known as a Q factor. The Q factor of an inductor is the magnitude of the ratio of its reactance to the effective series resistance at a particular frequency. The Q factor is an important measure of an inductors performance because it significantly affects the frequency response of the circuit utilizing such devices.

Inductors utilized in Monolithic Microwave Integrated Circuits (MMIC) applications are known as lumped elements. These types of inductors are utilized in a variety of microwave applications such as filters, couplers, power level monitors, attenuators, power combiners/dividers and other types of matching networks.

There has been an increasing demand in MMIC technologies to reduce the dissipation losses in matching networks including both lumped and distributed elements such as inductors and microstrip lines, respectively. The dissipation losses relate to the power lost due to the internal impedance of the elements included in these matching networks. One reason for this low loss requirement of matching networks is to improve the noise figure in low noise amplifiers and the power added efficiency performance in power amplifiers.

Inductors in MMIC technologies play an important role in reducing dissipation losses of matching networks. This is because it has been determined that at the low end of microwave frequencies, circuits utilizing lumped elements are more suitable than distributed elements. The lumped element approach better utilizes all of the available area on a GaAs substrate, which makes it more compatible with conventional GaAs monolithic processing. Further, the distributed approach, results in a larger size and, poor performance in terms of isolation capability and amplitude balance at the output ports.

Another concern in regard to inductors utilized in MMIC applications is the size of such devices. Wireless applications where the range of operation varies from 800 to 2000 MHz and military applications, require compact MMICs without compromising performance in order to meet cost goals. This requires lumped elements such as inductors, capacitors and resistors that are compact and are capable of providing adequate performance. Currently available monolithic inductor technology is not suitable to meet performance and cost goals for commercial monolithic ICs. This is because the current technology requires either external inductors or enlarges the chip size to a great degree when all of the impedance matching inductors are included in such an IC.

It is therefore, an object of the present invention to provide a monolithic inductor with low losses and a compact size, which is also compatible with conventional IC fabrication processes.

SUMMARY OF THE INVENTION

A monolithic inductor device is disclosed which typically includes a substrate. The improvement includes a layer of dielectric material disposed over the substrate. A first inductor pattern is disposed on the substrate and a second inductor pattern is disposed on the dielectric layer. The inductor patterns are coupled together to form a single inductive element, which has reduced dissipation losses and an improved frequency response due to the dielectric material.

It is further disclosed that a second layer of dielectric material is included. The second dielectric layer is disposed between the substrate and the first conductor layer in order to further enhance performance of the device.

BRIEF DESCRIPTION OF THE DRAWING

The above objects, further features and advantages of the present invention are described in detail below in conjunction with the drawings, of which.

DETAILED DESCRIPTION OF THE DRAWING

The present invention is directed to a low loss and compact inductor, which is also compatible with conventional GaAs monolithic processes. This is accomplished by fabricating these inductors by utilizing a two plating level scheme along with additional layers of dielectric material. The inductors made according to the present invention will enable the realization of low loss, compact and extremely low cost passive components such as couplers, narrowband filters, baluns and dividers/combiners.

Figure 1:
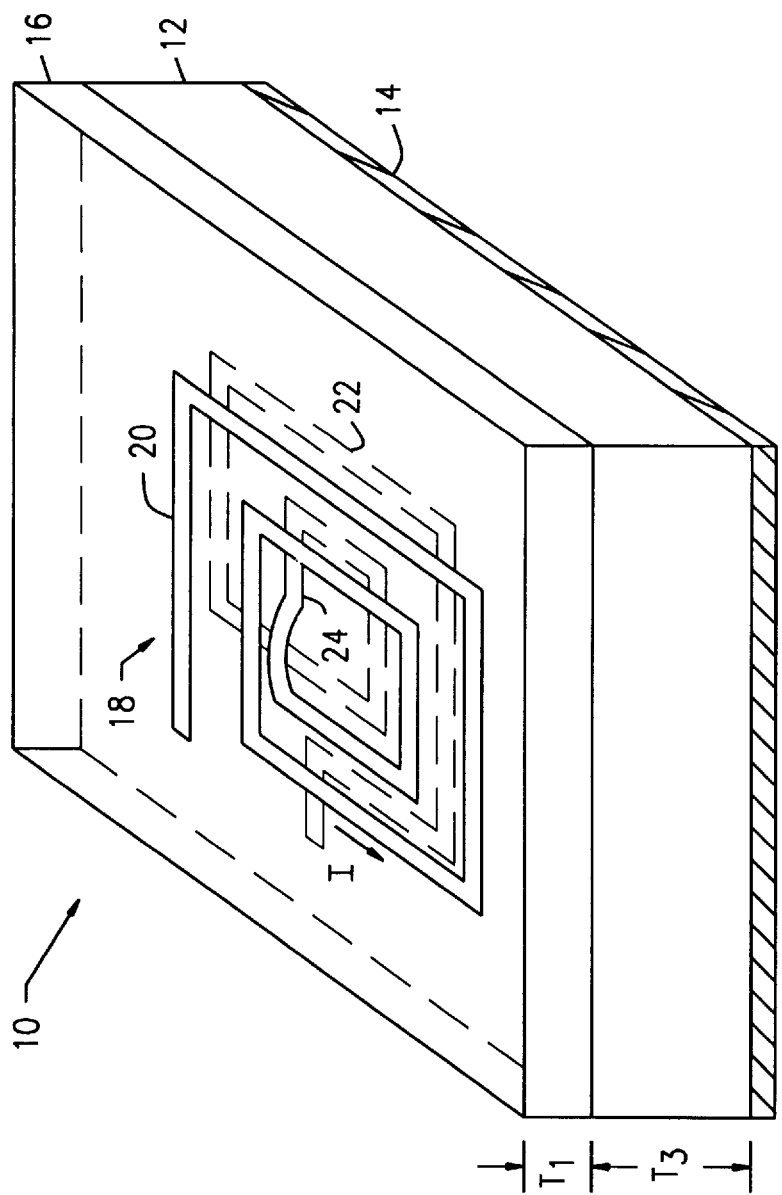
FIG. 1 is a perspective view of the first embodiment of the monolithic inductor according to the present invention.

Referring to FIG. 1, there is shown a perspective view of the first embodiment of the monolithic inductor according to the present invention. The first embodiment of the inductor 10 includes a substrate 12 having a predetermined thickness $T_3$. The substrate 12 includes a layer of metallized material 14 disposed on a lower surface which functions as a ground plane. Disposed on an upper surface of the substrate 12 is a layer of dielectric material 16 having a predetermined thickness $T_1$. The dielectric material 16 is preferably a polyimide material which will be discussed in detail later.

As is evident from FIG. 1, the inductor 10 has inductor patterns 20,22 fabricated utilizing a two level plating scheme. This scheme includes a first inductor pattern 22 disposed directly on the substrate 12, wherein it is disposed between the substrate 12 and dielectric material 16. Further, a second inductor pattern 20 is disposed on the dielectric layer 16, wherein the second inductor pattern 20 overlays the first pattern 22. The inductor patterns 20,22 are coupled by a via hole 24 contained in the dielectric layer 16. The inductor patterns 20,22 are fabricated from a conductive material such as gold which preferably has a thickness of 10 um. Based on this structure, the inductor 10 does not require the use of the high resistive Metal One for cross over as used in conventional inductors fabricated for MMIC applications.

The inductor 10 made according to the present invention has a number of advantages. The inductor 10 as previously described has two layers of inductor patterns 20,22 which overlay each other and are coupled together obtaining two times more inductance for the same size as conventional monolithic inductors. The inductor 10 utilizes thick plating for lowering the DC and low frequency RF resistance, which enables it to have a much higher Q factor as compared to conventional monolithic inductors. Since the inductor 10 does not require the use of Metal One, it is also able to be utilized as a choke for biasing power circuits.

The configuration of the inductor 10 is also desirable because it has a higher mutual inductance. The higher mutual inductance is due to the two layers of inductor patterns 20,22 being coupled together so that the RF current I flows in the same direction through both patterns, which enables the magnetic flux lines to add in phase and thus results in a higher mutual inductance. This enables the inductor 10 to have three to four times more inductance than conventional inductors of the same physical area, utilizing the same conductor dimensions and spacings. Thus, for a given conductor length, the inductance is 1.5 to 2 times higher and the resistance is 1.5 to 2 lower, which results in a much higher Q factor. This result has been confirmed by performing electromagnetic (EM) simulations.

The configuration of the inductor 10 is further desirable since it produces a device with a relatively higher resonant frequency. This is due to the electric field lines generated within the inductor 10 either residing in the air or in the dielectric material 14 which has a relatively low dielectric constant.

The previously described dielectric layer 16 is utilized in the present invention in order to substantially reduce the dissipation loss of the inductor 10. This is accomplished when the dielectric layer 16 has a permittivity less than that of the material utilized as the substrate 12.

The permittivity is defined as the property which describes the electric flux density produced when the material is excited by an electrical potential. Absolute permittivity is the ratio of the electric flux density produced by an electric field. Relative permittivity is the ratio of electric flux density produced in a material to the value in free space produced by the same electric field strength. Relative permittivity is also known as the dielectric constant of a material. Therefore, in order for the dielectric layer 16 to reduce dissipation losses, it must have a dielectric constant which is less than that of the substrate 12.

In the present invention, the dielectric layer 16 can be any material which has a dielectric constant less than that of the substrate material. However, polyimide material is preferred, which is a material utilized in various other electronic packaging applications. Thin films of this material can be spin cast or sprayed for use as IC passivation layers, while thicker films are used for flexible laminates. Polyimides exhibit desirable mechanical and electrical properties as well as high temperature properties.

Most commonly, polyimide films are cast as polyamic acid solutions which are thermally dehydrated to form the final polymer. Proper curing is necessary in order to obtain the best mechanical and electrical properties. The cured polymers are generally insoluble intractable materials, but such materials are not crosslinked. This distinction is important since polyimides with a modified chemical structure can be soluble.

In the present invention, the inductor 10 is preferably fabricated utilizing the ITT MSAG GaAs process, which is described in U.S. Pat. No. 4,832,761 to Geissberger et al., entitled PROCESS FOR MANUFACTURING GALLIUM ARSENIDE MONOLITHIC MICROWAVE INTEGRATED CIRCUITS USING NONPHOTOSENSITIVE ACID RESIST FOR HANDLING, issued May 23, 1989 and U.S. Pat. No. 4,847,212 to Balzan et al., entitled SELF ALIGNED GATE FET PROCESS USING UNDERCUT ETCH MASK, issued Jul. 11, 1989. Further, the dielectric layer 16 is preferably a thin layer of polyimide material having a thickness $T_1$ of 10 um. Preferably the substrate 12 is fabricated from GaAs material having a thickness $T_3$ in the range of 75 to 125 um. The dielectric constants of the GaAs substrate 12 and the polyimide dielectric layer 16 preferably is 12.9 and 3.0, respectively. Also, in a MMIC made according to the present invention, the other components such as FETs, capacitors, resistors and via pads are directly disposed on the substrate 16 along with the first inductor pattern 22.

Figure 2:
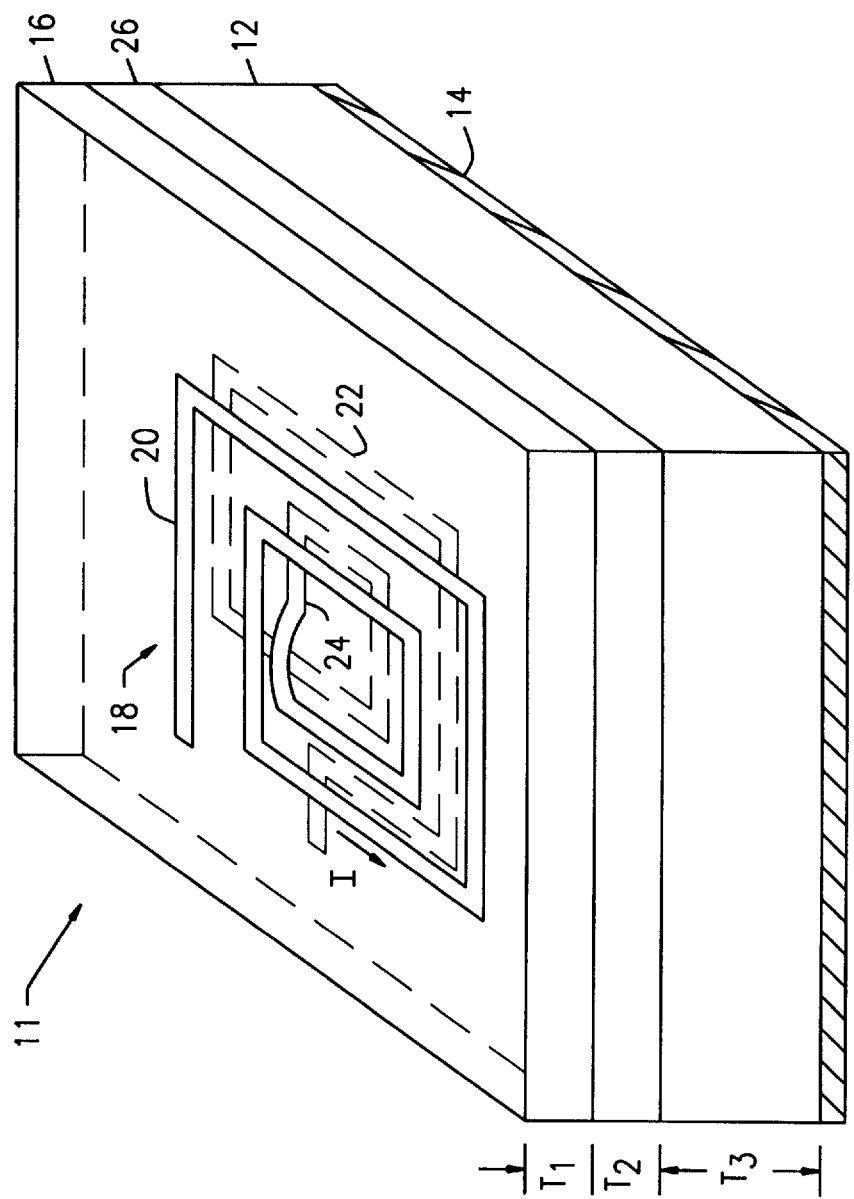
FIG. 2 is a perspective view of the second embodiment of the monolithic inductor according to the present invention.

Referring to FIG. 2, a perspective view of the second embodiment of the monolithic inductor according to the present invention is shown. The second embodiment of the inductor 11 is similar to the first embodiment except that another layer of dielectric material 26 is included. Thus, all the materials, parameters and performance characteristics previously described in regard to the first embodiment, apply equally to the second embodiment 11. The dielectric layer 26 is disposed between the substrate 12 and the first inductor pattern 22, and functions to further enhance performance of the inductor 11. The performance is enhanced by further reducing the dissipation losses and improving the frequency response of these devices.

In the present invention, the second dielectric layer 26 is also preferably a layer of polyimide material having a predetermined thickness $T_2$ in the range of 3 to 10 um and a dielectric constant of 12.9. Further, it also preferable that the second embodiment 11 is fabricated utilizing the ITT MSAG GaAs process.

In regard to both embodiments of the present invention, a monolithic inductor structure is described which has three to four times more inductance, lower DC and RF resistance, much higher DC current carrying capacity, compact size, lower cost and has the ability to greatly enhance power amplifiers which currently use external inductors or distributed microstrip lines. This also minimizes the coupling between closed spaced elements to acceptable levels enabling a highly integrated circuit to be fabricated on a small chip size at a lower cost.

While the invention has been particularly shown and described with reference to preferred embodiments thereof, it will be understood by those skilled in the art that changes in form and details may be made therein without departing from the spirit and scope of the present invention.

What is claimed is:

1. A monolithic inductor device which including a substrate having a dielectric constant of 12.9, wherein the improvement therewith comprising:

a layer of dielectric material comprising a cured, dehydrated polyamide film having a dielectric constant of 3.0 and a thickness of 10 um disposed over said substrate;

a first inductor pattern disposed directly onto said substrate, wherein said first inductor pattern is disposed between said substrate and said dielectric material;

a second inductor pattern disposed on said dielectric layer, means for coupling said first inductor pattern with said second inductor pattern so as to form a single inductive element extending through said dielectric material having said dielectric constant less than the dielectric constant of said substrate to reduce dissipation losses and improve the frequency response of the device.

2. The device of claim 1, which further includes a second layer of dielectric material disposed between said substrate and said layer of dielectric material.

3. The device of claim 2, wherein said second layer of dielectric material comprises a cured, dehydrated polymide film having a dielectric constant of 12.9.

4. The device of claim 1, wherein said means for coupling said first inductor pattern with said second inductor pattern is a via hole contained within said layer of dielectric material.

5. The device of claim 1, wherein said coupling means is operable to permit RF current to flow in the same direction in both said inductor patterns thereby increasing the inductance of said device.

6. The device of claim 1, wherein said first and second inductor patterns are gold conductors.

7. The device of claim 6, wherein said gold conductors have a thickness of 10 um.

8. The device of claim 1, wherein said substrate is a Gallium Arsenide (GaAs) material having a thickness of between 75 um and 125 um.

9. A monolithic inductor device, comprising:

a substrate having a dielectric constant of 12.9, a layer of dielectric material comprising a cured, dehydrated polyamide film having a dielectric constant of 3.0 disposed over said substrate;

a first inductor pattern disposed directly onto said substrate wherein said first inductor pattern is disposed between said substrate and said dielectric material;

a second inductor pattern disposed on said dielectric layer, means for coupling said first inductor pattern with said second inductor pattern so as to form a single inductive element extending through said dielectric material having said dielectric constant less than the dielectric constant of said substrate to reduce dissipation losses and improve the frequency response of the device.

10. The device of claim 9, which further includes a second layer of dielectric material disposed between said substrate and said layer of dielectric material.

11. The device of claim 10, wherein said second layer of dielectric material comprises a cured, dehydrated polymide film having a dielectric constant of 12.9.

12. The device of claim 9, wherein said means for coupling said first inductor pattern with said second inductor pattern is a via hole contained within said layer of dielectric material.

13. The device of claim 9, wherein said coupling means is operable to permit RF current to flow in the same direction in both said inductor patterns thereby increasing the inductance of said device.

14. The device of claim 9, wherein said first and second inductor patterns are gold conductors.

15. The device of claim 14, wherein said gold conductors have a thickness of 10 um.

16. The device of claim 9, wherein said substrate is a Gallium Arsenide (GaAs) material having a thickness of between 75 um and 125 um, and wherein said layer of dielectric material has a thickness of 10 um.

* * * * *